US008188812B2

(12) United States Patent
Tanaka et al.

(10) Patent No.: US 8,188,812 B2
(45) Date of Patent: May 29, 2012

(54) ELASTIC WAVE DEVICE AND LADDER FILTER DEVICE

(75) Inventors: Nobuhira Tanaka, Nagaokakyo (JP); Masashi Omura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/984,621

(22) Filed: Jan. 5, 2011

(65) Prior Publication Data

US 2011/0095844 A1 Apr. 28, 2011

Related U.S. Application Data

(63) Continuation of application No. PCT/JP2009/002672, filed on Jun. 12, 2009.

(30) Foreign Application Priority Data

Jul. 10, 2008 (JP) ................................ 2008-180569

(51) Int. Cl.
*H03H 9/64* (2006.01)

(52) U.S. Cl. ..................... 333/193; 333/133; 310/313 B

(58) Field of Classification Search .......... 333/193–196, 333/133; 310/313 B
See application file for complete search history.

(56) References Cited

U.S. PATENT DOCUMENTS 5,619,175 A * 4/1997 Bauregger .................... 333/195
5,699,026 A 12/1997 Kurp et al.
7,190,241 B2 * 3/2007 Ebata et al. .................. 333/193
2005/0151601 A1 7/2005 Furusato et al.
2005/0270124 A1 12/2005 Ebata et al.

FOREIGN PATENT DOCUMENTS

GB 2 421 860 A 7/2006
JP 10-150342 A 6/1998
JP 2000-183680 A 6/2000
JP 2005-184566 A 7/2005
JP 2006-20285 A 1/2006
JP 2006-101082 A 4/2006
JP 2006-191797 A 7/2006
WO 94/21040 A1 9/1994

OTHER PUBLICATIONS

Official Communication issued in International Patent Application No. PCT/JP2009/002672, mailed on Sep. 15, 2009.

* cited by examiner

*Primary Examiner* — Barbara Summons
(74) *Attorney, Agent, or Firm* — Keating & Bennett, LLP

(57) ABSTRACT

An elastic wave device includes a first elastic wave resonator and a second elastic wave resonator that are connected in series to each other, and a resistor is connected in parallel with the first elastic wave resonator while no resistors are connected in parallel with the second elastic wave resonator.

4 Claims, 6 Drawing Sheets

FIG. 1A
FIG. 1B
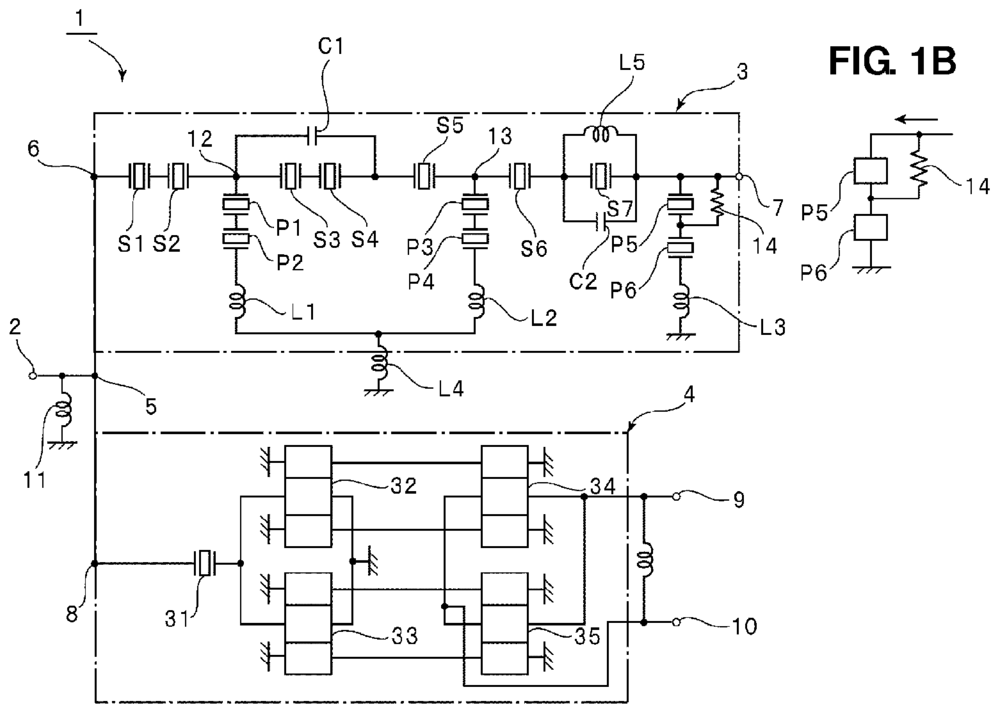
FIG. 2
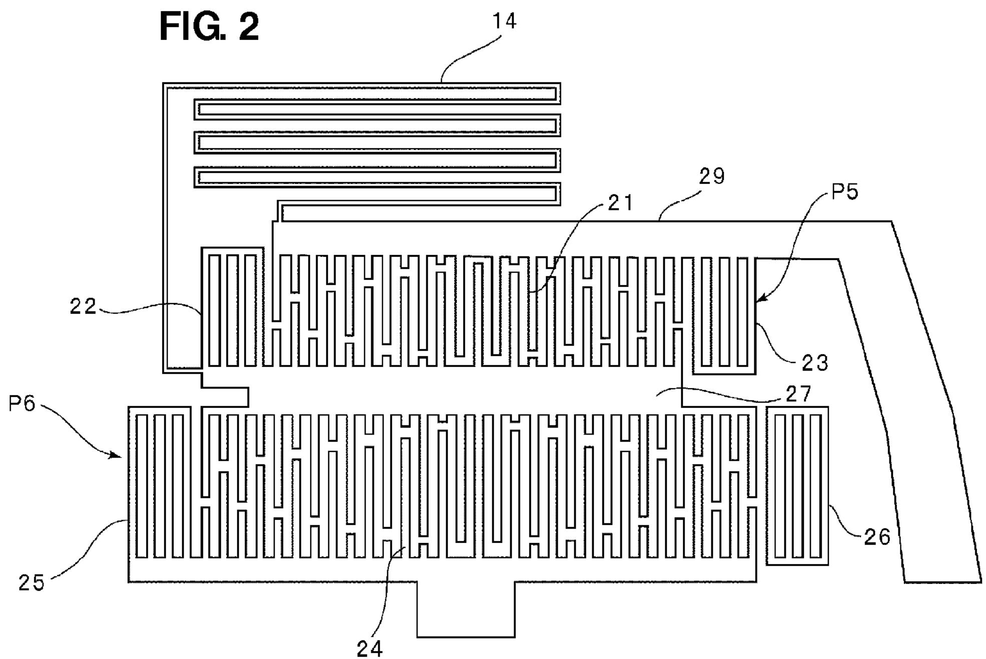

ELASTIC WAVE DEVICE AND LADDER FILTER DEVICE

BACKGROUND OF THE INVENTION

1. Field of the Invention

The present invention relates to elastic wave devices used in band pass filters and the like, and in particular, to an elastic wave device including a plurality of elastic wave resonators connected in series and a ladder filter that includes the elastic wave device.

2. Description of the Related Art

Resonators and filters that use elastic waves, such as surface acoustic waves, are widely used in cellular phones, for example. The resonators and filters that use elastic waves include IDT electrodes arranged to excite elastic waves.

Since the electrode finger pitch of an IDT electrode is very small, the IDT electrode may be damaged if a voltage above the withstand voltage is applied thereto. For example, in the process of manufacturing elastic wave devices, or in the process of mounting elastic wave devices on the substrates of cellular phones, static electricity is likely to be generated in the elastic wave devices or the equipment including the elastic wave devices. When an elastic wave device that includes static electricity comes into contact with a metal of the equipment or when the terminal of an elastic wave device comes into contact with equipment that includes static electricity, a high voltage may be applied to a resonator, causing damage to the IDT electrode.

To solve these problems, International Publication No. 94/21040, for example, discloses a circuit illustrated in FIG. 10. Here, a resistor $R_P$ is connected in parallel with a surface acoustic wave filter 101. Through this resistor $R_P$, a discharge current can be passed when the surface acoustic wave filter 101 contacts an electrostatically charged portion. Thereby, damage due to static electricity is prevented, according to International Publication No. 94/21040. It is disclosed that the resistance of the resistor $R_P$ must be greater than the impedance of the IDT electrode of the surface acoustic wave filter 101, and more specifically, that damage caused by static electricity is prevented when the resistor $R_P$ has a resistance ranging from 1.5 kΩ to 3 kΩ.

For example, an IC is connected in a stage subsequent to a surface acoustic wave filter used in the RF stage of a cellular phone. For the IC to operate normally, it is required that the surface acoustic wave filter have an insulation resistance ranging from $10^6\Omega$ to $10^7\Omega$. However, it is disclosed that, in the configuration described in International Publication No. 94/21040, damage due to static electricity can be prevented when the parallel resistor $R_P$ has a resistance ranging from 1.5 kΩ to 3 kΩ. Thus, when the configuration described in International Publication No. 94/21040 is provided, the IC connected in a subsequent stage does not operate normally.

SUMMARY OF THE INVENTION

To overcome the problems described above, preferred embodiments of the present invention provide an elastic wave device and a ladder filter device that includes the elastic wave filter device in which damage due to static electricity is reliably prevented without making the insulation resistance on the output side very small.

A preferred embodiment of the present invention provides an elastic wave device including a plurality of elastic wave resonators connected in series to one another, and a resistor connected in parallel with at least one of the plurality of the elastic wave resonators. Among the plurality of the elastic resonators, no resistors are connected in parallel with the remaining elastic resonators excluding the at least one of the plurality of the elastic wave resonators.

The total impedance of the at least one of the plurality of the elastic wave resonators is preferably greater than the total impedance of the remaining elastic wave resonators, for example. In this case, damage caused by static electricity can be more reliably prevented.

A ladder filter device according to another preferred embodiment of the present invention includes an input terminal, an output terminal, a plurality of series arm resonators provided on a series arm extending between the input terminal and the output terminal, and a parallel arm resonator provided on at least one parallel arm extending between the series arm and a ground potential, and at least one of the series arm resonators and the parallel arm resonator is defined by the elastic wave device according to a preferred embodiment of the present invention. Thus, damage to the ladder filter device caused by static electricity can be reliably prevented.

The parallel arm resonator preferably includes a first parallel arm resonator provided at least one of a location between the input terminal and the ground potential and a location between the output terminal and the ground terminal, and a second parallel arm resonator provided between the ground potential and at least one connection node between the series arm resonators adjacent to each other, and the first parallel arm resonator is preferably defined by the elastic wave device. In this case, since the first parallel arm resonator which is more likely to be damaged by static electricity is defined by the elastic wave device according to a preferred embodiment of the present invention, damage caused by static electricity can be effectively prevented.

However, in a preferred embodiment of the present invention, a portion of the series arm resonators of a plurality of the series arm resonators may be defined by the elastic wave device according to a preferred embodiment of the present invention. Also in this case, damage caused by static electricity can be effectively prevented.

In the elastic wave device according to a preferred embodiment of the present invention, among a plurality of elastic wave resonators connected in series to one another, a resistor is preferably connected in parallel with at least one of the elastic wave resonators and no resistors are connected in parallel with the remainder of the elastic wave resonators. Thus, damage due to static electricity can be effectively prevented without considerably decreasing the insulation resistance.

In the ladder filter device according to various preferred embodiments of the present invention, since at least a portion of the series arm resonators and the parallel arm resonators is defined by the elastic wave device according to a preferred embodiment of the present invention, damage caused by static electricity is prevented.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1A is a circuit diagram of a duplexer including a transmission filter that includes an elastic wave device according to a preferred embodiment of the present invention, and FIG. 1B is a circuit diagram illustrating the elastic wave device according to a preferred embodiment of the present invention.

FIG. 2 is a schematic plan view illustrating a specific electrode structure of the elastic wave device in a preferred embodiment of the present invention.

DETAILED DESCRIPTION OF THE PREFERRED EMBODIMENTS

Figure 3:
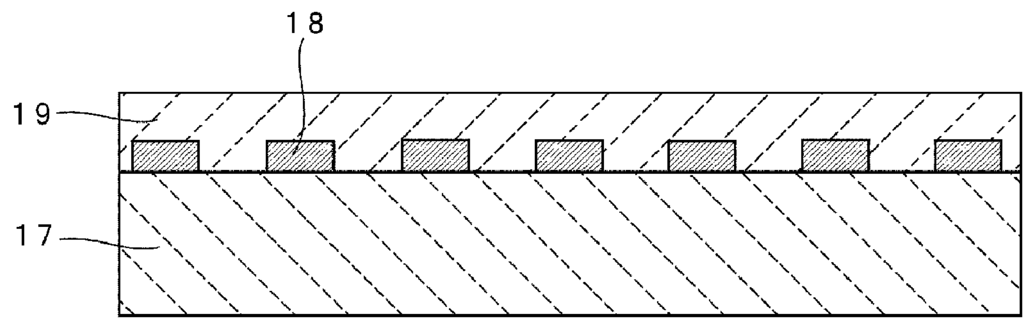
FIG. 3 is a schematic sectional view of a surface acoustic wave device defined by an elastic wave device according to a preferred embodiment of the present invention.

Hereinafter, preferred embodiments of the present invention will be described below with reference to the drawings.

FIG. 1A is circuit diagram of a duplexer including an elastic wave device according to a first preferred embodiment of the present invention. FIG. 1B is a circuit diagram illustrating the elastic wave device according to the first preferred embodiment of the present invention.

A duplexer 1 of the first preferred embodiment is preferably used in the RF stage of a cellular phone, for example.

The duplexer 1 preferably includes an antenna terminal 2. A transmission filter 3 and a receiving filter 4 are preferably connected to the antenna terminal 2. More specifically, an output terminal 6 which is an end of the transmission filter 3 is preferably connected to the connection node 5. The other end of the transmission filter 3 is preferably a transmission terminal 7. An input terminal 8 of the receiving filter 4 is connected to a connection node 5. First and second receiving terminals 9 and 10 are provided at the other end of the receiving filter 4. The connection node 5 is connected to the antenna terminal 2 and an inductor 11 is connected between the antenna terminal 2 and the ground potential.

The transmission filter 3 is preferably a ladder filter device that includes the transmission terminal 7 which is an input terminal, a series arm extending from the transmission terminal 7 to an output terminal 6, a plurality of parallel arms extending between the series arm and the ground potential. The transmission filter 3 preferably includes a plurality of series arm resonators S1 to S7, for example. The series arm resonators S1 to S7 are connected in series to one another, and are arranged sequentially from the output terminal 6 to the transmission terminal 7. A capacitor C1 is preferably connected in parallel with the series arm resonators S3 and S4, for example.

Parallel arm resonators P1 and P2, for example, are preferably provided on a parallel arm that extends between the ground potential and a connection node 12 of the series arm resonator S2 and the series arm resonator S3. The parallel arm resonator P1 and the parallel arm resonator P2 are preferably connected in series to each other.

Similarly, a parallel arm resonator P3 and a parallel arm resonator P4, for example, are preferably provided on a parallel arm that extends between the ground potential and a connection node 13 of the series arm resonator S5 and the series arm resonator S6. The parallel arm resonators P3 and P4 are preferably connected in series to each other.

Further, a parallel arm resonator P5 and a parallel arm resonator P6, for example, are preferably provided on a parallel arm that extends between the transmission terminal 7 and the ground potential. The parallel arm resonator P5 and the parallel arm resonator P6 are preferably connected in series to each other.

An inductor L1 is connected in series to the parallel arm resonators P1 and P2. Similarly, an inductor L2 is connected in series to the parallel arm resonators P3 and P4, and an inductor L3 is connected in series to the parallel arm resonators P5 and P6. The ground potential ends of the inductors L1 and L2 are preferably connected together to the ground potential through an inductor L4. Here, the inductors L1 to L4 correspond to inductance portions preferably provided by wiring lines, such as, wiring patterns and bonding wires, for example.

An inductor L5 and a capacitor C2 are electrically connected in parallel with the series arm resonator S7.

As illustrated in FIG. 3, the parallel arm resonator P5 in the first preferred embodiment is preferably a surface acoustic wave resonator. The surface acoustic wave resonator preferably includes a stack structure including an electrode structure 18 that is provided on a piezoelectric substrate 17, and a dielectric layer 19 preferably made of $SiO_2$, for example, that is arranged so as to cover the electrode structure 18. The normalized thickness of the $SiO_2$ layer is preferably less than about 0.4, for example, and surface acoustic waves are excited. The electrode structure 18 preferably includes electrode structures corresponding to the parallel arm resonator P5 illustrated in FIG. 2 and the parallel arm resonator P6. In a surface acoustic wave resonator, when an AC voltage is applied to the IDT electrode, a surface acoustic wave is excited which propagates with the energy concentrated on the surface of the stack that includes the dielectric layer 19 and the piezoelectric substrate 17, and the resonance characteristics based on the acoustic wave is preferably utilized.

In the transmission filter 3, preferably, a resistor 14 is connected in parallel with the parallel arm resonator P5, and no resistor is connected in parallel with the parallel arm resonator P6. A circuit portion including the parallel arm resonator P5, the parallel arm resonator P6, and the resistor 14 corresponds to a preferred embodiment of the elastic wave device of the present invention.

In the first preferred embodiment of the present invention, the impedance ratio of the parallel arm resonator P5 to the parallel arm resonator P6 is preferably about 2:1, for example. In other words, in the portion in which the parallel arm resonator P5 and the parallel arm resonator P6 are connected in series to each other, the impedance of the parallel arm resonator P5 arranged on the transmission terminal 7 side is preferably greater than the impedance of the parallel arm resonator P6 on the ground potential side.

FIG. 2 is a schematic plan view illustrating a specific electrode structure of the elastic wave device. In the first preferred embodiment, each of the parallel arm resonator P5 and the parallel arm resonator P6 is preferably a one-port elastic wave resonator, for example. The parallel arm resonator P5 preferably includes an IDT electrode 21 and reflectors 22 and arranged on both sides of the IDT electrode 21 in the propagation direction of an elastic wave. Similarly, the parallel arm resonator P6 preferably includes an IDT electrode and reflectors 25 and 26. A busbar on one side of the parallel arm resonator P5 and a busbar on one side of the parallel arm resonator P6 define a common busbar 27. An end of the resistor 14 preferably defined by a meandering conductor pattern, for example, is connected to the common busbar 27. The other end of the resistor 14 is preferably electrically connected to a busbar 29 which is on the side of the IDT electrode 21 opposite the common busbar 27 side. Thus, the resistor 14 is connected in parallel with the parallel arm resonator P5. Note that the resistor 14 may be defined not only by a meandering conductor pattern but also by a conductor pattern having any other suitable shape. Further, the resistor may preferably be defined by a resistance material, for example.

Since the busbar on one side of each of the parallel arm resonator P5 and the parallel arm resonator P6 is defined by common busbar 27, the size of the elastic wave device is reduced. However, the busbars of the parallel arm resonator P5 and the parallel arm resonator P6 are not necessarily defined by a common busbar.

The receiving filter 4 is preferably an elastic wave device having a balanced-unbalanced transforming function, including the input terminal 8 and the first and second receiving terminals 9 and 10 as output terminals. Here, first and second longitudinally coupled three-IDT resonator elastic wave filter units 32 and 33 are preferably connected to the input terminal 8 through a one-port elastic wave resonator 31. Third and fourth longitudinally coupled three-IDT resonator elastic wave filter units 34 and 35 are preferably respectively connected to the first and second longitudinally coupled three-IDT resonator elastic wave filter units 32 and 33 in a subsequent stage. The longitudinally coupled three-IDT resonator elastic wave filter units 34 and 35 are respectively connected to the first and second receiving terminals 9 and 10.

In the first preferred embodiment, since an elastic wave device including the parallel arm resonator P5, the parallel arm resonator P6, and the resistor 14 is provided in the transmission filter 3, surge withstand capability is improved without causing a considerable decrease in insulating resistance. This will be clarified by comparing an existing example and a comparative example respectively illustrated in FIG. 4 and FIG. 5.

Figure 4:
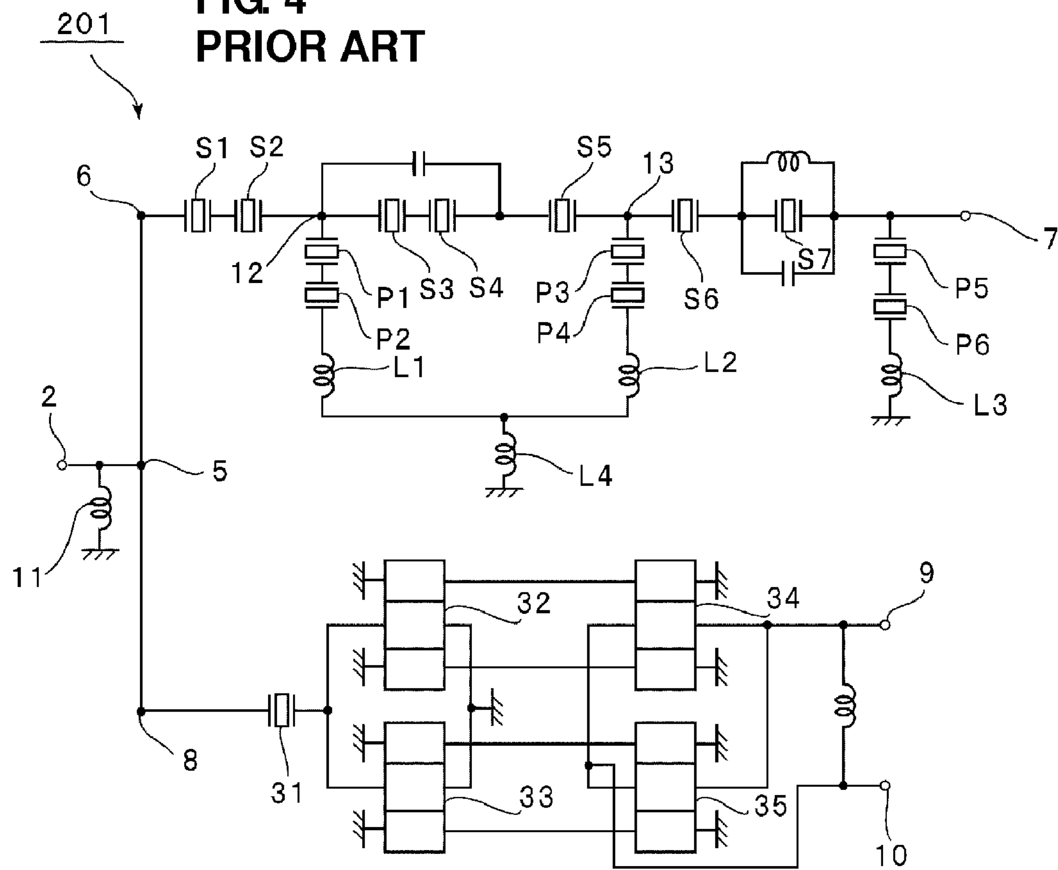
FIG. 4 is a schematic circuit diagram of an existing duplexer.

FIG. 4 illustrates a circuit diagram of an existing duplexer 201 which has the same configuration as the above-described preferred embodiment except that the resistor 14 is not provided and the parallel arm resonator P5 and the parallel arm resonator P6 have the same or substantially the same impedance. Here, the parallel arm resonator P5 and the parallel arm resonator P6 have the same or substantially the same impedance, and the impedance Z of the series connection structure is the same or substantially the same as the impedance Z of the series connection structure of the first preferred embodiment. In other words, in the first preferred embodiment, the impedance of the parallel arm resonator P5 is preferably (⅔)Z and the impedance of the parallel arm resonator P6 is preferably (Z/3).

Figure 5:
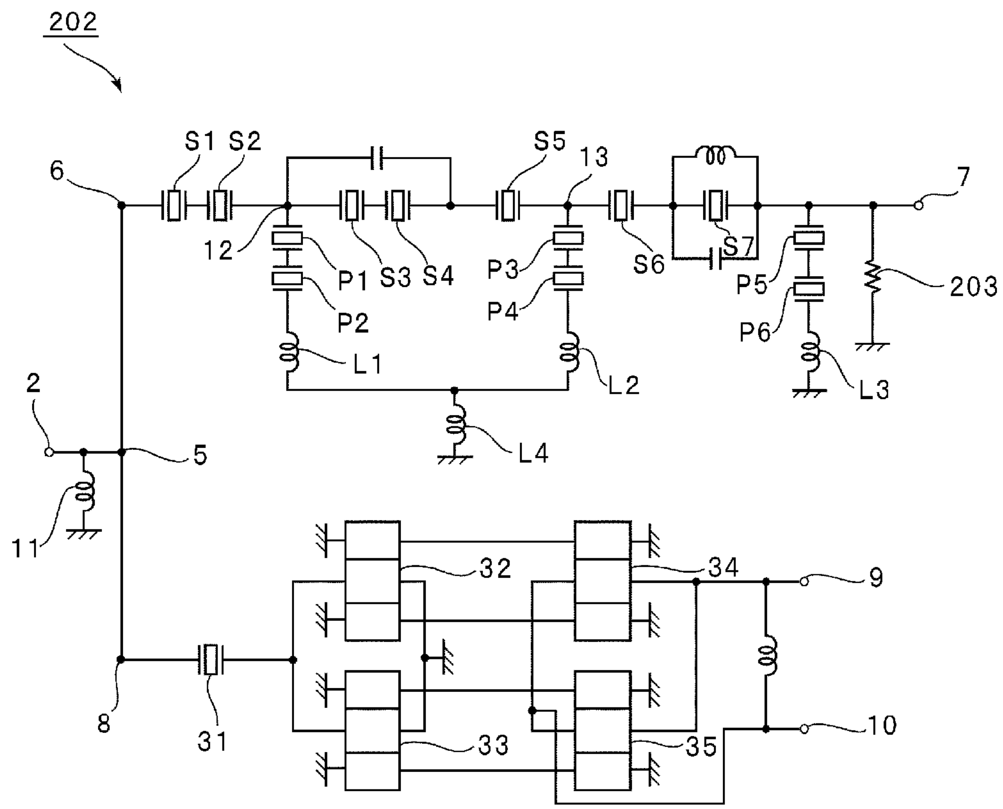
FIG. 5 illustrates a circuit configuration of a duplexer prepared as a comparative example.

On the other hand, in a duplexer 202 illustrated in FIG. 5, which is a comparative example, a resistor 203 is connected between the transmission terminal and the ground potential, i.e., in parallel with both the parallel arm resonator P5 and the parallel arm resonator P6. The remainder of the configuration of the duplexer 202 is the same or substantially the same as that of the duplexer 1 of the first preferred embodiment.

According to the first preferred embodiment, surge withstand capability is improved as compared to the existing example and the comparative example. In the existing example illustrated in FIG. 4, no resistors are connected in parallel with the parallel arm resonator P5 and the parallel arm resonator P6. When a surge voltage V0 is applied across the transmission terminal and the ground potential in this case, the voltage applied to the respective parallel arm resonators are denoted by VA=ZA/(ZA+ZB)×V0 and VB=ZB/(ZA+ZB)×V0, where ZA is the impedance of the parallel arm resonator P5 and ZB is the impedance of the parallel arm resonator P6. Therefore, when there is a difference between the two impedances, a voltage greater than V0/2 is applied to the resonator having a higher impedance.

On the other hand, since the resistor 14 is preferably connected in parallel with the parallel arm resonator P5 in the first preferred embodiment, a discharge current can be passed through the resistor 14. Thus, the parallel arm resonator P5 is unlikely to be damaged. Regarding the parallel arm resonator P6, since the applied voltage is V0/3, a lower voltage is applied as compared to the existing example described above. Thus, the surge withstand capability is effectively improved according to the first preferred embodiment.

As described above, the impedance of the parallel arm resonator P5, with which the resistor is connected in parallel, is preferably greater than the impedance of the parallel arm resonator P6, with which the resistor 14 is not connected in parallel. In this case, when a plurality of elastic wave resonators are connected in parallel with which a resistor and one or more elastic wave resonators are not connected in parallel with the resistor, the total impedance of at least one of the elastic wave resonators with which the resistor is connected in parallel is preferably greater than the total impedance of the remaining elastic wave resonators.

In the comparative example described above, the resistor 203 is connected between the transmission terminal and the ground. To improve surge withstand capability, a resistor with a resistance in a range from about $10^3\Omega$ to about $10^4\Omega$, for example, is preferably provided as the resistor 203 as described in International Publication No. 94/21040. However, in this case, the insulating resistance becomes very high, and thus, it is difficult for an IC connected to the duplexer 202 to operate normally.

On the other hand, insulating resistance IR is not significantly deteriorated in the first preferred embodiment since the parallel arm resonator P6, with which no resistors are connected in parallel, is provided.

In addition, according to the first preferred embodiment, insertion loss in the transmission band is decreased as compared to the comparative example.

Figure 6:
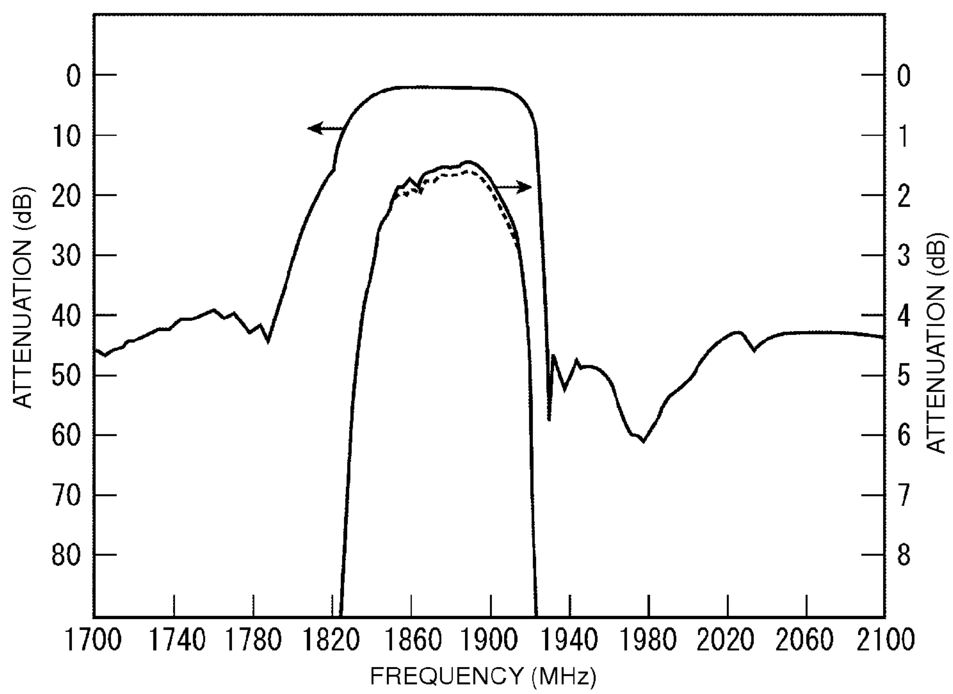
FIG. 6 illustrates the frequency characteristics of transmission filters in the duplexers of the comparative example and a preferred embodiment of the present invention.

FIG. 6 illustrates the frequency characteristics of the transmission filter of each duplexer. Here, the pass band of the transmission filter ranges from about 1850 MHz to about 1910 MHz, and the pass band of the receiving filter ranges from about 1930 MHz to about 1990 MHz.

The characteristics illustrated in FIG. 6 are the results corresponding to a case in which the parallel arm resonators were formed as follows.

The piezoelectric substrate was preferably a 126° $LiNbO_3$ substrate and a configuration was provided in which each IDT electrode was preferably embedded in a $SiO_2$ layer. In other words, the configuration was preferably provided by forming a $SiO_2$ layer having a thickness of about 110 nm on the piezoelectric substrate, opening a portion for forming an IDT electrode using patterning, forming an IDT electrode in the opening by forming a stack that includes metal layers where the thicknesses of the layers, in order from the top, were Al/Cu/NiCr=about 10/80/10 nm, and forming a $SiO_2$ dielectric layer having a thickness of about 500 nm as the uppermost layer over the entire area.

The number of electrode finger pairs of the IDT electrode in each of the parallel arm resonator P5 and the parallel arm resonator P6 was preferably 125.

Weighting of intersecting width of the IDT electrode: the intersecting width is about 120 μm at the center, decreases as it gets closer to both ends in the propagation direction of a surface acoustic wave, and is about 12 μm at both ends.

In the existing example described above, the number of electrode finger pairs of each of the parallel arm resonator P5 and the parallel arm resonator P6 is about 100, and regarding the weighting of the intersecting width, the intersecting width is about 100 μm at the center, decreases as it gets closer to both ends in the propagation direction of a surface acoustic wave, and is about 10 μm at both ends.

All other parameters and dimensions are common among the resonators as follows.

Wavelength λ determined by the electrode finger pitch of the IDT electrode=about 3.9 μm, duty ratio of the IDT electrode fingers=about 0.5.

Number of electrode fingers of the reflector=20.

Opening length of the electrode fingers of the reflector=about 20 μm.

Wavelength λ determined by the electrode finger pitch of the reflector=about 3.9 μm.

Duty ratio of the electrode finger of the reflector=about 0.5.

The resistor 14 was preferably formed using the same metal material and at the same time as the IDT electrode, for example. The line width was preferably about 0.5 μm and the layer width was preferably about 100 nm, for example. The length of the line was preferably about 7500 μm, for example, in the first preferred embodiment. In other words, the resistor 14 was preferably a meandering conductor pattern including 50 straight line portions each having a length of about 150 μm, for example.

In FIG. 6, the solid lines show the filter characteristics of the first preferred embodiment, and the broken line shows the filter characteristics of the comparative example. Note that the characteristics of the duplexer 201 of the existing example described above are similar to those of the first preferred embodiment and the line therefore overlaps the solid line in FIG. 6. Thus, the characteristics are not shown independently in FIG. 6.

As can be seen from FIG. 6, in the comparative example, in which the resistor 202 has a resistance of about 1.5 kΩ, the minimum insertion loss in the pass band is about 1.56 dB.

On the other hand, it can be seen that according to the first preferred embodiment, the minimum insertion loss in the pass band is decreased to about 1.41 dB, where the resistor 14 has a resistance of about 1 kΩ. Thus, as compared to the duplexer 202 of the comparative example, according to the first preferred embodiment, the insertion loss in the pass band can be decreased since the resistor is connected to only the parallel arm resonator P5.

Thus, according to the first preferred embodiment, surge withstand capability can be effectively improved without increasing the insulation resistance since, in the parallel arm resonator P5, which is closest to the transmission terminal 7 and is more likely to be influenced by static electricity, the resistor 14 is connected in parallel with the parallel arm resonator P5 and no resistors are connected in parallel with the parallel arm resonator P6.

Figure 7:
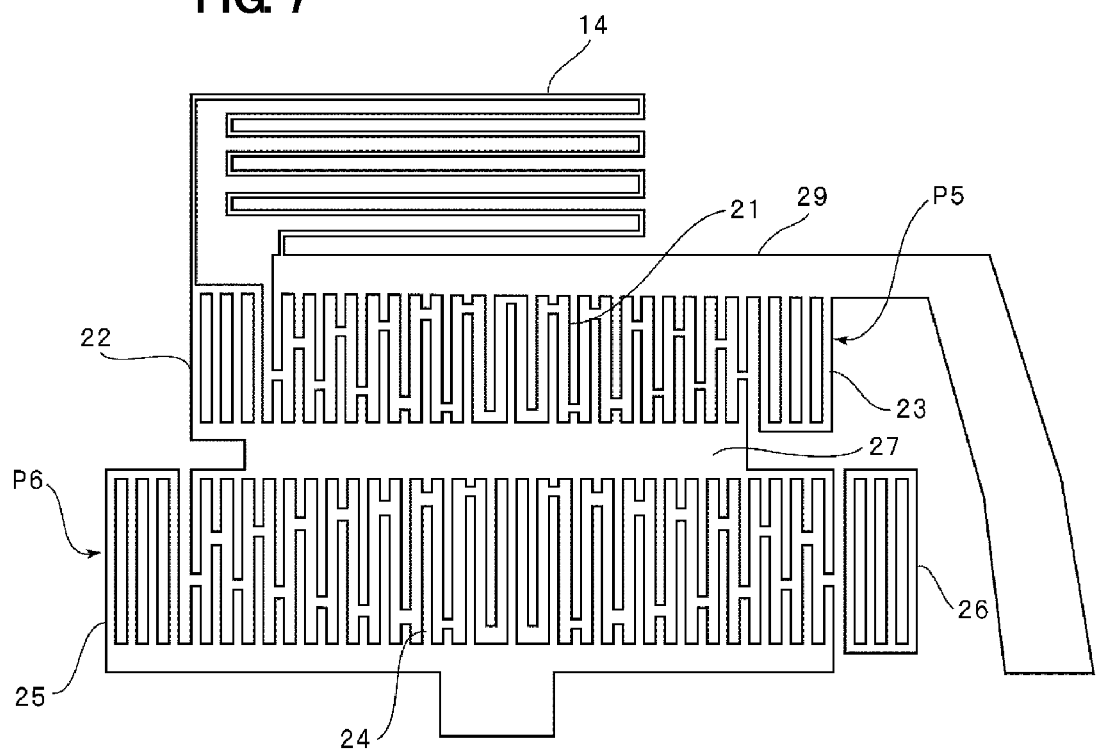
FIG. 7 is a plan view of an electrode structure of an exemplary modification of the elastic wave filter device according to a preferred embodiment of the present invention.

Note that although an end of the resistor 14 is preferably connected to the common busbar 27 in FIG. 2, as in another preferred embodiment illustrated in FIG. 7, by connecting the common busbar 27 to the reflector 22, the end of the resistor 14 may preferably be connected to the end of the reflector 22 on the side opposite the common busbar 27 side.

Figure 8A:
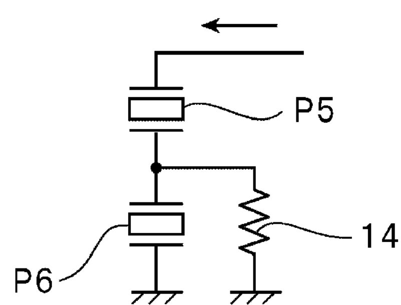
FIGS. 8A to 8D are circuit diagrams illustrating exemplary modifications of the circuit configuration of the elastic wave filter device according to a preferred embodiment of the present invention.

In addition, although the resistor 14 is preferably connected in parallel with the parallel arm resonator P5 in the first preferred embodiment, the resistor 14 may preferably be connected in parallel with the parallel arm resonator P6 according to another preferred embodiment as illustrated in FIG. 8A, without connecting the resistor in parallel with the parallel arm resonator P5.

Figure 8B:
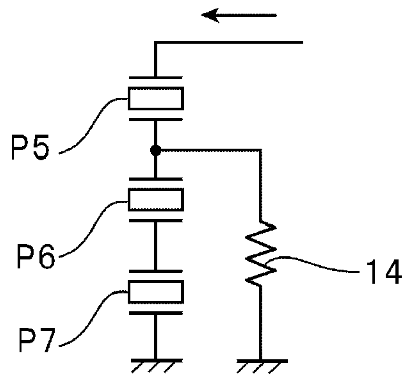
Figure 8C:
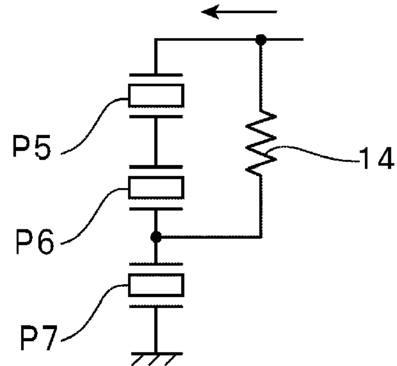
Figure 8D:
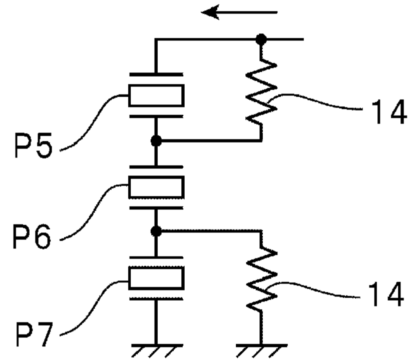

Further, as illustrated in FIGS. 8B to 8D, in additional preferred embodiments of the present invention, three parallel arm resonators P5 to P7 may preferably be connected in series. In FIG. 8B, no resistors are connected in parallel with the parallel arm resonator P5, and the resistor 14 is preferably connected in parallel with the parallel arm resonators P6 and P7. In FIG. 8C, the resistor 14 is preferably connected in parallel with the parallel arm resonators P5 and P6, and no resistors are connected in parallel with the parallel arm resonator P7, which is provided on the ground potential side.

In FIG. 8D, the resistors 14 and 14 are preferably respectively connected in parallel with the transmission terminal side parallel arm resonator P5 and the ground potential side parallel arm resonator P7, and no resistors are connected in parallel with the central parallel arm resonator P6. In such a configuration in which a plurality of elastic wave resonators are connected in series to one another, the elastic wave device according to a preferred embodiment of the present invention can be configured in various forms if a resistor is connected in parallel with at least one of the elastic wave resonators and no resistors are connected in parallel with the rest of the elastic wave resonators. Advantages similar to the above-described preferred embodiments can be obtained.

Note that in the first preferred embodiment, the elastic wave resonator defined by the surface acoustic wave device illustrated in FIG. 3 is provided. In the structure illustrated in FIG. 3, by making the normalized layer width of the $SiO_2$ layer greater than one, an elastic wave resonator utilizing a boundary acoustic wave propagating along the boundary of the piezoelectric substrate and the dielectric may preferably be used. In addition, a resonator utilizing a bulk wave as an elastic wave by using a piezoelectric layer illustrated in FIG. 9 may preferably be used according to another preferred embodiment of the present invention.

Figure 9:
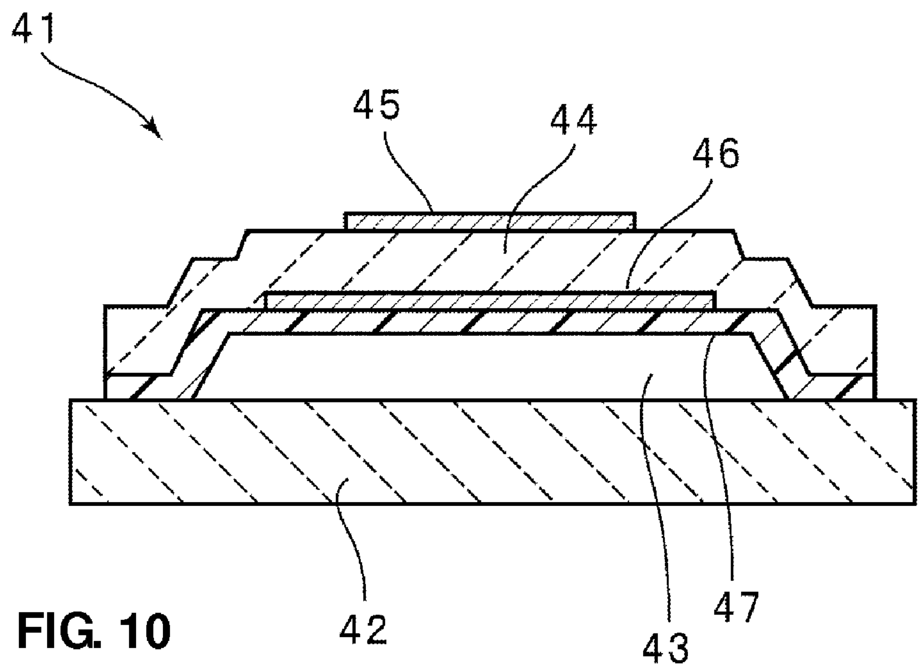
FIG. 9 is a sectional view of a thin film piezoelectric resonator as an example of the elastic wave filter device according to a preferred embodiment of the present invention.
Figure 10:
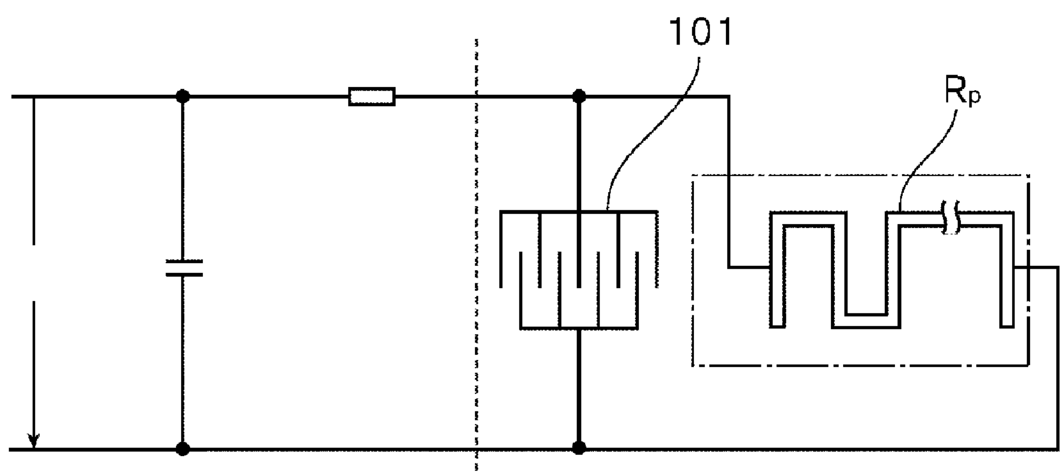
FIG. 10 is a circuit diagram illustrating an exemplary existing surface acoustic wave device.

In an elastic wave resonator 41 illustrated in FIG. 9, a piezoelectric thin layer 44 is preferably arranged on a substrate 42 with a cavity 43 therebetween. A first resonator electrode 45 and a second resonator electrode 46 are preferably respectively provided on the upper surface and lower surface of the piezoelectric thin layer 44. A portion at which the first and second resonator electrodes 45 and 46 face each other with the piezoelectric thin layer 44 therebetween defines a resonator portion, and a bulk wave as an elastic wave is excited by applying an AC voltage between the first and second resonator electrodes 45 and 46. Resonance characteristics based on this bulk wave oscillation are obtained. The piezoelectric thin layer is supported by a supporting layer 47. The elastic wave resonator 41 defined by such a piezoelectric film resonator that uses a bulk wave as an elastic wave is also a known structure and can be used as the elastic wave resonator according to a preferred embodiment of the present invention. In this case, by changing the facing areas of the first and second resonator electrodes 45 and 46, the impedance can be changed between the two resonators similarly to the parallel arm resonator P5 and the parallel arm resonator P6.

Note that although it is preferable to make the impedance of the parallel arm resonator P5 greater than that of the parallel arm resonator P6 as in the first preferred embodiment, the elastic wave resonator with which a resistor is connected in parallel and the remaining elastic wave resonators with which no resistors are connected in parallel may have the same impedance. In this case, since the resistor has an advantage of bypassing surge decrease, a high surge voltage can be withstood, as compared to the case in which no resistors are connected.

Although, in the first preferred embodiment, the parallel arm resonator P5 with which the resistor 14 is connected in parallel is preferably arranged on the parallel arm which is connected to the transmission terminal 7, on the series arm of the transmission filter 3, a configuration may preferably be provided in which, among other parallel arm resonators, at least one parallel arm resonator includes a resistor connected in parallel therewith and the remainder of the parallel arm resonators do not include any resistors connected in parallel therewith.

However, since a large surge voltage is likely to be applied to the transmission filter 3 from the transmission terminal 7 side, it is preferable that the elastic wave device according to preferred embodiments of the present invention be provided on the parallel arm, including the parallel arm resonators P5 and P6, connected to the transmission terminal 7 as in the first preferred embodiment.

The elastic wave device according to various preferred embodiments of the present invention in which a resistor is connected in parallel with at least one elastic wave resonator and no resistors are connected in parallel with the remaining resonators may preferably be provided on a series arm. For example, in the series arm resonators S6 and S7, a configuration may be provided in which a resistor is connected in parallel with at least one of the series arm resonators and no resistors are connected in parallel with the rest of the series arm resonators. In this case, the surge withstand voltage can be increased similarly to the first preferred embodiment.

Further, the configuration according to various preferred embodiments of the present invention in which an elastic wave resonator including a resistor connected in parallel therewith is connected in series to remaining elastic wave resonators can preferably be applied not only to ladder filter devices but also to various elastic wave filter devices, and a surge withstand voltage can be effectively increased similarly.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An elastic wave device comprising:

a plurality of elastic wave resonators connected in series to one another; and a resistor connected in parallel with at least one of the plurality of the elastic wave resonators; wherein among the plurality of the elastic wave resonators, no resistors are connected in parallel with the remaining elastic wave resonators of the plurality of elastic wave resonators excluding the at least one of the plurality of the elastic wave resonators; and a total impedance of the at least one of the plurality of the elastic wave resonators is greater than a total impedance of the remaining elastic wave resonators.

2. A ladder filter device comprising:

an input terminal;

an output terminal;

a plurality of series arm resonators provided on a series arm extending between the input terminal and the output terminal; and a parallel arm resonator provided on at least one parallel arm extending between the series arm and a ground potential; wherein at least one of the plurality of series arm resonators and the parallel arm resonator is the elastic wave device according to claim 1.

3. The ladder filter device according to claim 2, wherein the parallel arm resonator includes:

a first parallel arm resonator provided at at least one of a location between the input terminal and the ground potential and a location between the output terminal and the ground terminal; and a second parallel arm resonator provided between the ground potential and at least one connection node between series arm resonators of the plurality of series arm resonators adjacent to each other; wherein the first parallel arm resonator is defined by the elastic wave device.

4. The ladder filter device according to claim 2, wherein at least one of the plurality of series arm resonators is the elastic wave device.

* * * * *